United States Patent
Nam et al.

(10) Patent No.: US 11,699,587 B2
(45) Date of Patent: Jul. 11, 2023

(54) METHOD FOR MANUFACTURING DIAMOND SUBSTRATE

(71) Applicant: KOREA POLYTECHNIC UNIVERSITY INDUSTRY ACADEMIC COOPERATION FOUNDATION, Siheung-si (KR)

(72) Inventors: Ok Hyun Nam, Seoul (KR); Ui Ho Choi, Siheung-si (KR); Geun Ho Yoo, Incheon (KR)

(73) Assignee: KOREA POLYTECHNIC UNIVERSITY INDUSTRY ACADEMIC COOPERATION FOUNDATION, Siheung-si (KR)

( * ) Notice: Subject to any disclaimer, the term of this patent is extended or adjusted under 35 U.S.C. 154(b) by 199 days.

(21) Appl. No.: 17/297,635

(22) PCT Filed: Nov. 27, 2019

(86) PCT No.: PCT/KR2019/016511
§ 371 (c)(1),
(2) Date: May 27, 2021

(87) PCT Pub. No.: WO2020/111790
PCT Pub. Date: Jun. 4, 2020

(65) Prior Publication Data
US 2022/0285154 A1    Sep. 8, 2022

(30) Foreign Application Priority Data

Nov. 30, 2018  (KR) .................. 10-2018-0152579
Jul. 23, 2019  (KR) .................. 10-2019-0088718

(51) Int. Cl.
H01L 21/02    (2006.01)

(52) U.S. Cl.
CPC .... H01L 21/02527 (2013.01); H01L 21/0242 (2013.01); H01L 21/0245 (2013.01);
(Continued)

(58) Field of Classification Search
CPC ......... H01L 21/02527; H01L 21/02367; H01L 21/02376; H01L 21/02378;
(Continued)

(56) References Cited

U.S. PATENT DOCUMENTS

2017/0247814 A1*  8/2017  Noguchi  ........... H01L 21/02647

FOREIGN PATENT DOCUMENTS

| EP | 2492953 A2 * | 8/2012 | ....... H01L 21/02381 |
| JP | 11199379 | 7/1999 | |

(Continued)

OTHER PUBLICATIONS

KIPO, Notice of Allowance of KR 10-2019-0088718 dated Feb. 23, 2021.
KIPO, PCT Search Report of PCT/KR2019/016511 dated Mar. 4, 2020.

*Primary Examiner* — Matthew C Landau
*Assistant Examiner* — Azm A Parvez
(74) *Attorney, Agent, or Firm* — Lex IP Meister, PLLC

(57) ABSTRACT

The present invention relates to a method for manufacturing a diamond substrate, and more particularly, to a method of growing diamond after forming a structure of an air gap having a crystal correlation with a lower substrate by heat treatment of a photoresist pattern and an air gap forming film material on a substrate such as sapphire ($Al_2O_3$). Through such a method, a process is simplified and the cost is lowered when large-area/large-diameter single crystal diamond is heterogeneously grown, stress due to differences in a lattice constant and a coefficient of thermal expansion between the heterogeneous substrate and diamond is relieved, and an (Continued)

occurrence of defects or cracks is reduced even when a temperature drops, such that a high-quality single crystal diamond substrate may be manufactured and the diamond substrate may be easily self-separated from the heterogeneous substrate.

14 Claims, 3 Drawing Sheets

(52) U.S. Cl.
CPC .. *H01L 21/02378* (2013.01); *H01L 21/02381* (2013.01); *H01L 21/02387* (2013.01); *H01L 21/02403* (2013.01); *H01L 21/02414* (2013.01); *H01L 21/02425* (2013.01); *H01L 21/02447* (2013.01); *H01L 21/02455* (2013.01); *H01L 21/02472* (2013.01); *H01L 21/02483* (2013.01); *H01L 21/02488* (2013.01); *H01L 21/02491* (2013.01); *H01L 21/02645* (2013.01)

(58) Field of Classification Search
CPC ......... H01L 21/02381; H01L 21/02387; H01L 21/02403; H01L 21/02414; H01L 21/0242; H01L 21/02425; H01L 21/02447; H01L 21/0245; H01L 21/02455; H01L 21/02472; H01L 21/02483; H01L 21/02488; H01L 21/02491; H01L 21/02645; H01L 29/66007; C23C 16/27–279; C23C 14/0611
USPC ................. 438/105; 257/E21.041, E21.053, 257/E21.095, E21.096, E21.102, E21.323
See application file for complete search history.

(56) References Cited

FOREIGN PATENT DOCUMENTS

| | | |
|---|---|---|
| JP | 2011157268 | 8/2011 |
| JP | 2017-34220 | 2/2017 |
| JP | 2017052690 | 3/2017 |
| KR | 1019970042919 | 3/1999 |
| KR | 1019960011346 | 9/1999 |
| KR | 10-2006-0001015 | 1/2006 |
| KR | 10-0763467 | 10/2007 |
| KR | 10-1053116 | 8/2011 |

* cited by examiner

METHOD FOR MANUFACTURING DIAMOND SUBSTRATE

TECHNICAL FIELD

The present invention relates to a method for manufacturing a single crystal diamond substrate, and more particularly, to a method for manufacturing a single crystal diamond substrate that heterogeneously grows and self-separates a high quality single crystal diamond substrate.

BACKGROUND ART

A single crystal diamond semiconductor is a material having a very wide band gap (5.5 eV), and is a semiconductor material having very excellent physical properties such as high thermal conductivity, electron/hole mobility, and dielectric breakdown strength (10 MV/cm), and for this reason, the single crystal diamond semiconductor is expected to be used in various ways in high-frequency, high-power electronic devices having extreme performance in the future. The growth of such single crystal diamond for semiconductor devices is currently performed only by a high-temperature/high-pressure method. However, since only a very small die (≤10×10 mm$^2$) may be obtained and a high cost is required according to the high-temperature/high-pressure method, the single crystal diamond grown in this way has no price competitiveness to be applied as the semiconductor device.

To overcome such a problem, heterogeneous growth technology using chemical vapor deposition has been studied in earnest since the 1990s, and the diamond single crystal heterogeneous growth technologies presented so far have reached the extent that large-diameter incomplete single crystal diamond may be mainly grown on a single crystal Si substrate or a single crystal oxide substrate such as Al$_2$O$_3$ or MgO. That is, the conventional single crystal diamond heterogeneous growth method has an advantage of obtaining a large-diameter thin film or substrate, but has a problem that a large stress is introduced due to differences with a heterogeneous substrate in a lattice constant and a coefficient of thermal expansion to cause many defects and cracks when a temperature drops after growth, and thus, yield is low.

DISCLOSURE

Technical Problem

An object of the present invention is provided to a method for manufacturing a single crystal diamond substrate that may manufacture a high quality single crystal diamond substrate and easily self-separate a diamond substrate from a heterogeneous substrate by applying a simple process and a low-cost growth method of heterogeneously growing large-area/large-diameter single crystal diamond as a method of forming a structure of an air gap using a photoresist pattern on a substrate such as sapphire (Al$_2$O$_3$) to relieve stress due to differences with the heterogeneous substrate in a lattice constant and a coefficient of thermal expansion and reduce an occurrence of defects or cracks even when a temperature drops.

Technical Solution

According to an aspect of the present invention, a method for manufacturing a diamond substrate includes forming a repeated photoresist pattern on a lower substrate; depositing an air gap forming film; removing the photoresist by heat treatment and forming an air gap between the lower substrate and the air gap forming film; forming a buffer layer; forming a diamond thick film; and performing cooling so that the diamond thick film is self-separated from the lower substrate.

The photoresist pattern may include a stripe, circular, or polygonal shape as an embossed or engraved shape.

In the forming of the air gap, the air gap forming film is bonded to the lower substrate while being crystallized in the same orientation as the lower substrate and the photoresist is evaporated by the heat treatment, such that the air gap may be formed at a location where the photoresist was present.

The air gap may be formed to obtain the diamond substrate by relieving stress due to differences in a lattice constant and a coefficient of thermal expansion between the lower substrate and a heterogeneous diamond thick film and reducing an occurrence of defects or cracks in the diamond thick film during the cooling.

The lower substrate may be an Al$_2$O$_3$ substrate, an MgO substrate, an iridium substrate, a quartz substrate, a platinum substrate, an SiC substrate, a YSZ substrate, an SrTiO$_3$ substrate, a silicon substrate, a SOI substrate, or a group 3-5 compound semiconductor substrate.

The air gap forming film may be formed of Al$_2$O$_3$, MgO, iridium quartz, platinum, SiC, YSZ, SrTiO$_3$, Si, or a group 3-5 compound semiconductor material.

In the forming of the air gap, a temperature of the heat treatment may be in the range of 500 to 2000° C.

When the air gap forming film is made of SiC, Si, or a group 3-5 compound semiconductor, the forming of the buffer layer may include sequentially stacking an oxide layer made of a metal oxide containing α-Al$_2$O$_3$ or γ-Al$_2$O$_3$, MgO, SrTiO$_3$, or YSZ, and a metal layer made of a platinum group metal containing iridium (Ir), platinum (Pt), or rhodium (Rh) or a material containing Ni.

When the air gap forming film is made of SiC, Si, or a group 3-5 compound semiconductor, the forming of the buffer layer may include forming a layer containing SiC.

When the air gap forming film is made of an Al$_2$O$_3$, MgO, YSZ, iridium, quartz, platinum, or SrTiO$_3$, the forming of the buffer layer may include forming a metal layer made of a platinum group metal containing iridium (Ir), platinum (Pt), or rhodium (Rh) or a material containing Ni.

In the forming of the buffer layer, atomic layer deposition (ALD), chemical vapor deposition (CVD), or physical vapor deposition (PVD) equipment may be used.

In the forming of the diamond thick film, hot filament-CVD (HF-CVD), microwave plasma-CVD (MP-CVD), or RF plasma-CVD (RF-CVD) equipment may be used as chemical vapor deposition (CVD) equipment.

The forming of the diamond thick film may include forming a diamond crystal nuclear layer having a nuclear density of 10$^5$ cm$^{-2}$ or more; and growing a single crystal diamond thick film on the diamond crystal nuclear layer.

Advantageous Effects

According to the method for manufacturing a single crystal diamond substrate according to the present invention, by applying a simple process and a low-cost growth method of heterogeneously growing large-area/large-diameter single crystal diamond as a method of forming a structure of the air gap using the photoresist pattern on a substrate such as sapphire (Al$_2$O$_3$), it is possible to manufacture a high quality single crystal diamond substrate and easily self-separate a diamond substrate from a heterogeneous substrate by relieving stress due to differences with the heterogeneous substrate in a lattice constant and a coefficient of thermal expansion and reducing an occurrence of defects or cracks even when a temperature drops.

For example, according to the present invention, by forming the patterns in various shapes on the sapphire ($Al_2O_3$) substrate using a semiconductor photolithography process, depositing $Al_2O_3$ on the patterns, and performing heat treatment, as the photoresist inside the patterns is removed, the $Al_2O_3$ film outside the patterns is crystallized in the same orientation as the sapphire substrate below to thereby form a structure in which an air gap is formed between the sapphire substrate and the $Al_2O_3$ thin film, and the single crystal diamond is grown on the structure. As such, in the case of growing the diamond on the air gap structure, since the diamond material grown on the patterns spaced apart from each other reduces defects in the diamond through side growth, and reduces the occurrence of defects or cracks during cooling due to the stress reduction effect between the heterogeneous substrate and the diamond growth layer, it is possible to manufacture a self-separating large-diameter single crystal diamond substrate.

DESCRIPTION OF DRAWINGS

The accompanying drawings, which are included as part of the detailed description to aid in understanding of the present invention, provide embodiments of the present invention and describe the technical spirit of the present invention together with the detailed description.

DETAILED DESCRIPTION OF MAIN ELEMENTS

Figure 1:
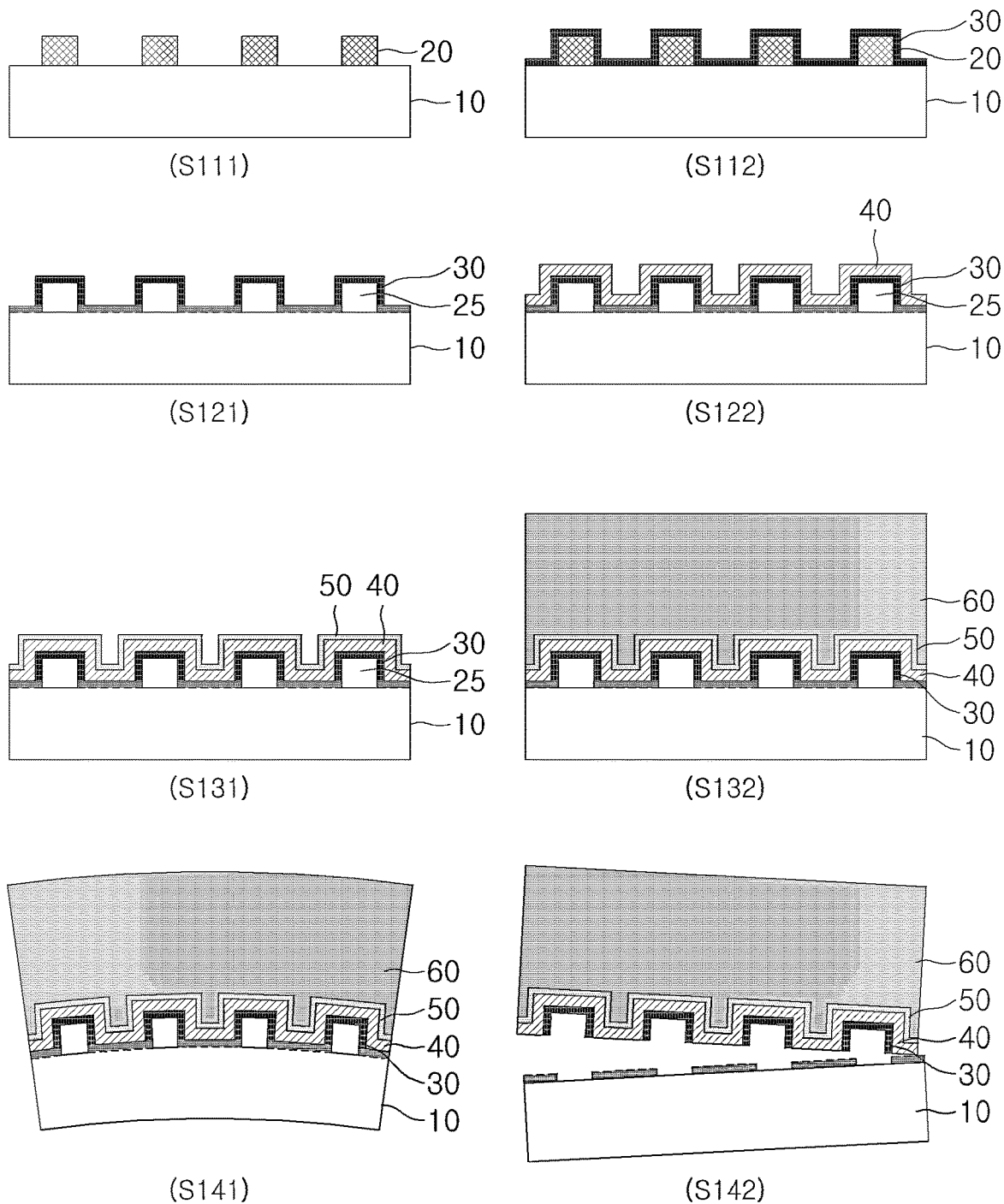
FIG. 1 is a process flowchart illustrating a method of manufacturing a single crystal diamond substrate according to an embodiment of the present invention.

10; lower substrate
20; photoresist pattern
25: air gap
30: air gap forming film
40: buffer layer
50: diamond crystal nuclear layer
60; diamond thick film layer
50, 60; diamond thick film

BEST MODE

Hereinafter, the present invention will be described in detail with reference to the accompanying drawings. Here, throughout the accompanying drawings, the same components will be denoted by the same reference numerals. In addition, a detail description for functions and/or configurations that have been well-known will be omitted. In the following specification, portions required for understanding operations according to various embodiments will be mainly described, and a description for components that may obscure the gist thereof will be omitted. In addition, some components in the accompanying drawings may be exaggerated, omitted, or schematically shown. Sizes of the respective components do not reflect actual sizes of the respective components. Therefore, contents mentioned herein are not limited by relative sizes of or intervals between components shown in the accompanying drawings.

In describing the embodiments of the present invention, when it is determined that a detailed description of known technologies related to the present invention may unnecessarily obscure the subject matter of the present invention, a detailed description thereof will be omitted. In addition, terms to be described later are terms defined in consideration of functions in the present invention, which may vary according to the user, the intention of an operator, or the custom. Therefore, the terms should be defined on the basis of the contents throughout the present specification. The terms used in the detailed description are only for describing the embodiments of the present invention, and should not be limiting. Unless explicitly used otherwise, expressions in the singular form include the meaning of the plural form. In the present description, expressions such as "comprising" or "including" are intended to refer to certain features, numbers, steps, actions, elements, some or a combination thereof, and should not be construed to exclude the presence or possibility of one or more other features, numbers, steps, actions, elements, some or combination thereof other than those described.

Further, terms used in the specification, 'first', 'second', etc. can be used to describe various components, but the components are not to be construed as being limited to the terms, and the above terms are used only for the purpose of distinguishing one component from another component.

FIG. 1 is a process flowchart illustrating a method of manufacturing a single crystal diamond substrate according to an embodiment of the present invention.

Referring to FIG. 1, a method for manufacturing a single crystal diamond substrate according to an embodiment of the present invention includes a step (S111) of forming a repeated photoresist pattern 20 on a lower substrate 10, a step (S112) of depositing an air gap forming film 30, a step (S121) of removing the photoresist by heat treatment and forming an air gap 25 between the lower substrate 10 and the air gap forming film 30, a step (S122) of forming a buffer layer 40, steps (S131 and S132) of forming a diamond nucleation layer 50 and a diamond thick film 60, and a step (S141) of performing cooling so that the diamond thick films 50 and 60 are self-separated from the lower substrate 10, thereby obtaining a high-quality diamond substrate separated from the lower substrate 10 (S142). The diamond thick films 50 and 60, for example, may have a thickness of 1000 nm to 100 mm, and may be separated from the lower substrate 10 and used as a bulk substrate for forming various electronic devices such as transistors, diodes, and light emitting diodes (LEDs).

Hereinafter, the method for manufacturing a single crystal diamond substrate according to an embodiment of the present invention will be described in more detail.

First, a lower substrate 10 is prepared. The lower substrate 10 is preferably a sapphire ($Al_2O_3$) substrate, but an MgO substrate, an iridium substrate, a quartz substrate, a platinum substrate, an SiC substrate, a Yttria Stabilized Zirconia (YSZ) substrate, an $SrTiO_3$ substrate, a silicon substrate, a silicon on insulator (SOI) substrate, a group 3-5 compound semiconductor (e.g., GaN) substrate, or the like may also be used. Hereinafter, an example of using the sapphire ($Al_2O_3$) substrate as the lower substrate 10 is mainly described, but the lower substrate 10 is not limited thereto, and it may be well understood by those skilled in the art that the above various substrates may be similarly applied even if the various substrates are used as the lower substrate 10. A size of the lower substrate 10 may be a piece specimen of about 1×1 mm$^2$ for experimental purposes, but in order to obtain a large-area/large-diameter single crystal diamond substrate, various sizes of substrates suitable for purposes, up to a size of a 12-inch large-diameter wafer or larger, are possible.

If the lower substrate 10 is prepared as described above, a repeated photoresist pattern 20 is formed on the lower substrate 10 (S111). For example, the photoresist pattern 20 may be formed by applying photoresist 20 on the lower substrate 10 and exposing and developing it with electron beam, X-ray, ultraviolet rays, and the like using photolithography equipment such as a stepper. The shape of the photoresist pattern 20 formed as described above includes a stripe, circles, or polygonal shape (e.g., triangle, square, or the like). The photoresist pattern 20 may be the shape as described above as an embossed or engraved shape. The size of each photoresist pattern 20 may range from 1 nm to 100 μm in diameter, and may range from 1 nm to 100 μm in thickness.

If the repeated photoresist pattern 20 is formed on the lower substrate 10 as described above, then an air gap forming film 30 is deposited (S112). The air gap forming film 30 may be formed of $Al_2O_3$, MgO, iridium quartz, platinum, SiC, YSZ, $SrTiO_3$, Si, or a group 3-5 compound semiconductor material with a thickness of 10 nm to 10 μm. For example, in the case where the lower substrate 10 is a sapphire ($Al_2O_3$) substrate, the air gap forming film 30 is also preferably formed of $Al_2O_3$, but is not limited thereto, and as described below, it is possible to form the air gap forming film 30 using various materials as described above that may be bonded to the lower substrate 10.

Thereafter, the photoresist forming the photoresist pattern 20 is removed by heat treatment using a furnace or the like, and an air gap 25 is formed between the lower substrate 10 and the air gap forming film 30 (S121). In order to form the air gap 25, the heat treatment may be performed at a temperature in the range of 500 to 2000° C. By such heat treatment, the air gap forming film 30 is bonded (e.g., covalent bond, ionic bond, and the like) to the lower substrate 10 while being crystallized in the same orientation as the lower substrate 10 and the photoresist is evaporated into a small gap in the air gap forming film 30 such that the air gap 25 is formed as an empty space at a location where the photoresist was present.

By forming the air gap 25 as described above, the elasticity of the air gap forming film 30 is increased, such that stress due to difference between in a lattice constant and a coefficient of thermal expansion may be relieved when forming the single crystal diamond thick films 50 and 60 in a subsequent process, and the occurrence of defects or cracks in the diamond thick films 50 and 60 during cooling may be reduced, thereby obtaining a diamond substrate After the air gap 25 is formed as described above, a buffer layer 40 is formed (S122). The buffer layer 40 is formed as a cushion layer in consideration of the comparison of lattice constant and occurrence of stress before forming the single crystal diamond thick films 50 and 60. The buffer layer 40 may be formed as a single layer or a double layer having a total thickness of 10 nm to 100 μm in consideration of bonding properties of the upper and lower layers. The buffer layer 40 may be formed using atomic layer deposition (ALD), chemical vapor deposition (CVD), or physical vapor deposition (PVD) equipment.

For example, when the air gap forming film 30 is made of an oxide type such as $Al_2O_3$, MgO, YSZ, iridium, quartz, platinum, or $SrTiO_3$, the buffer layer 40 may be formed of a metal layer made of a platinum group metal containing iridium (Ir), platinum (Pt), or rhodium (Rh) or a material containing Ni.

In addition, for example, when the air gap forming film 30 is made of a semiconductor type such as SiC, Si, or a group 3-5 compound semiconductor, the buffer layer 40 may be formed of a layer containing SiC.

In addition, when the air gap forming film 30 is made of a semiconductor type such as SiC, Si, or a group 3-5 compound semiconductor, the buffer layer 40 may be formed as a double layer in which an oxide layer made of a metal oxide containing α-$Al_2O_3$ or γ-$Al_2O_3$, MgO, $SrTiO_3$, or YSZ, and a metal layer made of a platinum group metal containing iridium (Ir), platinum (Pt), or rhodium (Rh) or a material containing Ni are sequentially stacked.

Thereafter, single crystal diamond thick films 50 and 60 are formed on the buffer layer 40 (S131 and S132). The single crystal diamond thick films 50 and 60 may be formed using chemical vapor deposition (CVD) equipment, such as hot filament-CVD (HF-CVD), microwave plasma-CVD (MP-CVD), or RF plasma-CVD (RF-CVD) equipment.

The single crystal diamond thick films 50 and 60 are formed by, first, forming a diamond crystal nuclear layer 50 having a nuclear density (e.g., Bias Enhanced Nucleation (BEN) diamond density) of $10^5$ cm$^{-2}$ or more (S131), and then growing a single crystal diamond thick film layer 60, for example, in the range of thickness of 1000 nm to 100 mm so that diamond crystal is formed on deposited (fully coalesced) on the entire surface of the diamond crystal nuclear layer 50 using diamond crystal nucleus as a seed. For example, when the single crystal diamond thick film layer 60 is grown using the MP-CVD method, the single crystal diamond thick film layer 60 may be obtained at a thickness growth rate of 10 nm to 1000 μm/hr by appropriately adjusting a ratio (supply gas ratio) of $CH_4$, $O_2$, Ar, and $N_2$ to $H_2$ in the range of 0.1 to 50%, in growth temperature in a chamber of 100 to 1500° C., plasma power of 0.5 to 100 KW, and growth pressure of 0 to 1000 torr. With such a method, the single crystal diamond thick film layer 60 may be formed in the form in which the diamond crystal is grown on the patterns spaced apart from each other by the photoresist pattern 20, groove portions having a step between the patterns are also filled through side growth, and defects within the diamond are reduced.

Thereafter, the cooling is performed so that the diamond thick films 50 and 60 are self-separated from the lower substrate 10 (S141) to obtain a high-quality diamond substrate separated from the lower substrate 10 (S142).

A substrate having the single crystal diamond thick films 50 and 60 in the form of the separated films (e.g., 1000 nm to 100 mm in thickness) as described above may be a single crystal diamond substrate that may be used as a bulk substrate for forming various electronic devices.

Figure 2:
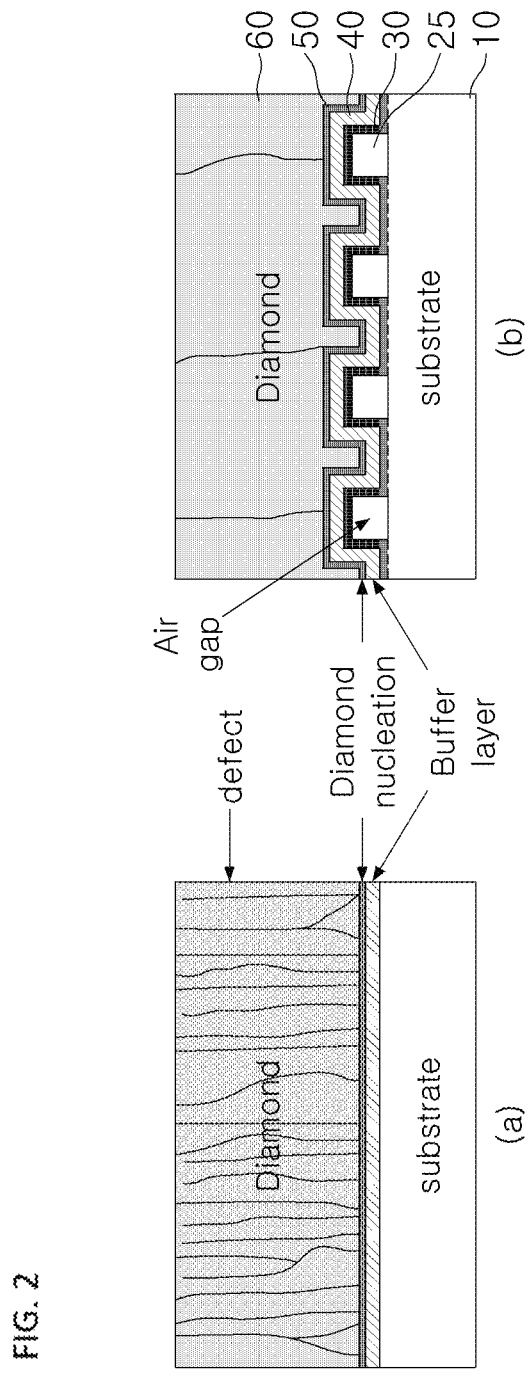
FIG. 2 is a view for comparing defect differences between a conventional diamond substrate and a diamond substrate based on the process of FIG. 1.

FIG. 2 is a view for comparing defect differences between a conventional diamond substrate (a) and a diamond substrate (b) based on the process of FIG. 1.

Figure 3:
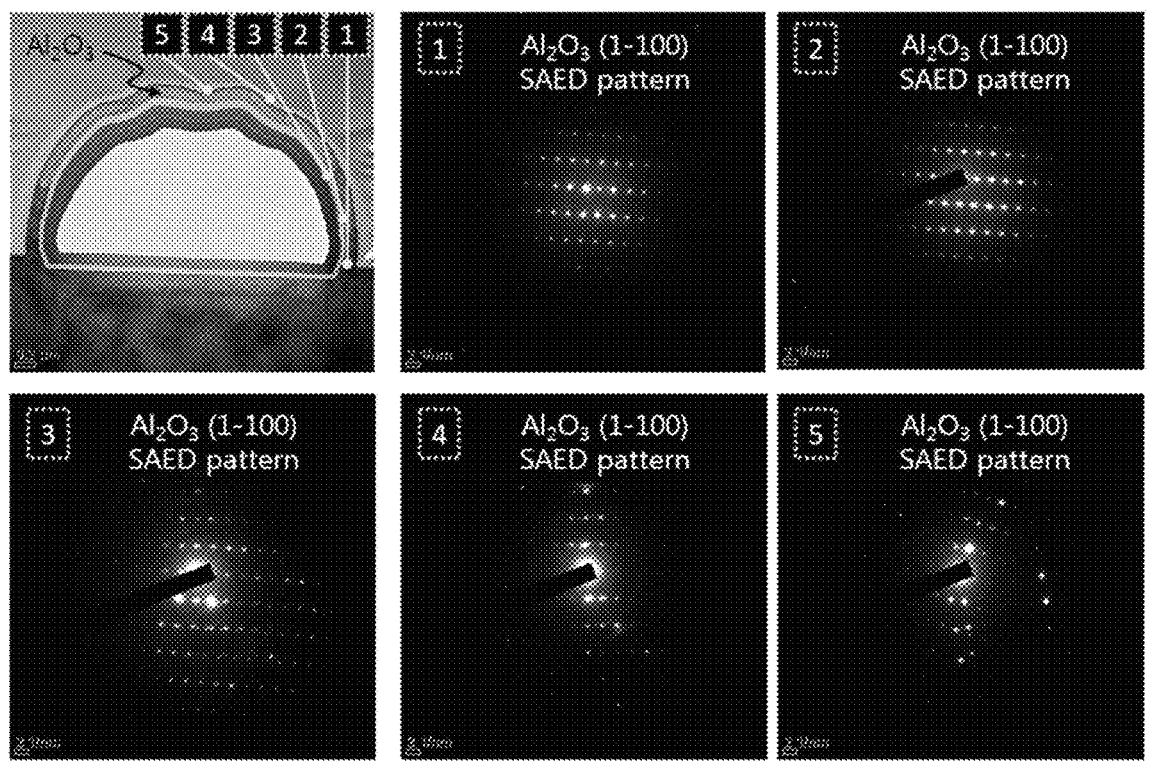
FIG. 3 is an example of a scanning electron microscope photograph of a form in which an air gap is formed based on the process of FIG. 1.

By forming the air gap 25 as illustrated in (b) of FIG. 2, stress due to differences between in a lattice constant and a coefficient of thermal expansion between the lower substrate 10 and heterogeneous diamond thick films 50 and 60 was relieved and the occurrence of defects or cracks in the diamond thick films 50 and 60 during cooling was reduced, thereby obtaining a diamond substrate FIG. 3 is an example of a scanning electron microscope (SEM) photograph of a form in which the air gap 25 is formed based on the process of FIG. 1.

FIG. 3 illustrates the respective selected area electron diffraction (SAED) patterns for the orientations of the corresponding crystal faces of the five points indicated in the first figure on an upper left when the air gap 25 is formed by using a sapphire ($Al_2O_3$) substrate as the lower substrate 10 and sapphire ($Al_2O_3$) as the air gap forming film 30. Through such electronic diffraction patterns, it may be seen that the air gap forming film 30 was crystallized in the same sapphire ($Al_2O_3$) crystal face orientation as the lower substrate 10 and bonded (e.g., covalent bond, ionic bond, and the like) to the lower substrate 10, and the structure of the air gaps 25 formed in correspondence with the repeated photoresist pattern 20 was well formed.

As described above, according to the method for manufacturing a single crystal diamond substrate according to the present invention, by applying a simple process and a low-cost growth method of heterogeneously growing large-area/large-diameter single crystal diamond as a method of forming a structure of the air gap 25 using the photoresist pattern 20 on a substrate such as sapphire ($Al_2O_3$), it is possible to manufacture a high quality single crystal diamond substrate and easily self-separate a diamond substrate from a heterogeneous substrate by relieving stress due to differences with the heterogeneous substrate in a lattice constant and a coefficient of thermal expansion and reducing an occurrence of defects or cracks even when a temperature drops. For example, according to the present invention, by forming the patterns in various shapes on the sapphire ($Al_2O_3$) substrate using a semiconductor photolithography process, depositing $Al_2O_3$ on the patterns, and performing heat treatment, as the photoresist inside the patterns is removed, the $Al_2O_3$ film outside the patterns is crystallized in the same orientation as the sapphire substrate below to thereby form a structure in which an air gap is formed between the sapphire substrate and the $Al_2O_3$ thin film, and the single crystal diamond is grown on the structure. As such, in the case of growing the diamond on the air gap structure, since the diamond material grown on the patterns spaced apart from each other reduces defects in the diamond through side growth, and reduces the occurrence of defects or cracks during cooling due to the stress reduction effect between the heterogeneous substrate and the diamond growth layer, it is possible to manufacture a self-separating large-diameter single crystal diamond substrate.

As described above, the present invention has been described by specific matters such as specific components and limited embodiments and drawings, but this is provided only to help a more general understanding of the present invention, and the present invention is not limited to the above embodiments, and those of ordinary skill in the field to which the present invention pertains will be able to make various modifications and variations without departing from the essential characteristics of the present invention. Therefore, the spirit of the present invention should not be limited to the described embodiments, and all technical ideas equivalent or equivalent to the claims as well as the claims to be described later are interpreted as being included in the scope of the present invention.

The invention claimed is:

1. A method for manufacturing a diamond substrate, the method comprising:
   forming a repeated photoresist pattern on a lower substrate;
   depositing an air gap forming film;
   removing the photoresist by heat treatment and forming an air gap between the lower substrate and the air gap forming film;
   forming a buffer layer;
   forming a diamond thick film; and
   performing cooling so that the diamond thick film is self-separated from the lower substrate.

2. The method of claim 1, wherein the photoresist pattern includes a stripe, circular, or polygonal shape as an embossed or engraved shape.

3. The method of claim 1, wherein in the forming of the air gap, the air gap forming film is bonded to the lower substrate while being crystallized in the same orientation as the lower substrate and the photoresist is evaporated by the heat treatment, such that the air gap is formed at a location where the photoresist was present.

4. The method of claim 1, wherein the air gap is formed to obtain the diamond substrate by relieving stress due to differences in a lattice constant and a coefficient of thermal expansion between the lower substrate and a heterogeneous diamond thick film and reducing an occurrence of defects or cracks in the diamond thick film during the cooling.

5. The method of claim 1, wherein the lower substrate is an $Al_2O_3$ substrate, an MgO substrate, an iridium substrate, a quartz substrate, a platinum substrate, an SiC substrate, a YSZ substrate, an $SrTiO_3$ substrate, a silicon substrate, a SOI substrate, or a group 3-5 compound semiconductor substrate.

6. The method of claim 1, wherein the air gap forming film is formed of $Al_2O_3$, MgO, iridium quartz, platinum, SiC, YSZ, $SrTiO_3$, Si, or a group 3-5 compound semiconductor material.

7. The method of claim 1, wherein in the forming of the air gap, a temperature of the heat treatment is in the range of 500 to 2000° C.

8. The method of claim 1, wherein when the air gap forming film is made of SiC, Si, or a group 3-5 compound semiconductor, the forming of the buffer layer includes sequentially stacking an oxide layer made of a metal oxide containing $\alpha$-$Al_2O_3$ or $\gamma$-$Al_2O_3$, MgO, $SrTiO_3$, or YSZ, and a metal layer made of a platinum group metal containing iridium (Ir), platinum (Pt), or rhodium (Rh) or a material containing Ni.

9. The method of claim 1, wherein when the air gap forming film is made of SiC, Si, or a group 3-5 compound semiconductor, the forming of the buffer layer includes forming a layer containing SiC.

10. The method of claim 1, wherein when the air gap forming film is made of an $Al_2O_3$, MgO, YSZ, iridium, quartz, platinum, or $SrTiO_3$, the forming of the buffer layer includes forming a metal layer made of a platinum group metal containing iridium (Ir), platinum (Pt), or rhodium (Rh) or a material containing Ni.

11. The method of claim 1, wherein in the forming of the buffer layer, atomic layer deposition (ALD), chemical vapor deposition (CVD), or physical vapor deposition (PVD) equipment is used.

12. The method of claim 1, wherein in the forming of the diamond thick film, hot filament-CVD (HF-CVD), microwave plasma-CVD (MP-CVD), or RF plasma-CVD (RF-CVD) equipment is used as chemical vapor deposition (CVD) equipment.

13. The method of claim 1, wherein the forming of the diamond thick film includes:
   forming a diamond crystal nuclear layer having a nuclear density of $10^5$ $cm^{-2}$ or more; and
   growing a single crystal diamond thick film on the diamond crystal nuclear layer.

14. A diamond substrate manufactured by the method for manufacturing the diamond substrate of claim 1, wherein the diamond substrate comprises:
an air gap forming film having a plurality of air gaps;
a buffer layer disposed on the air gap forming film;
a diamond crystal nuclear layer disposed on the buffer layer; and
a diamond thick film layer disposed on the diamond crystal nuclear layer, and
wherein the buffer layer, the diamond crystal nuclear layer and the diamond thick film layer have grooves formed by the plurality of air gaps.

* * * * *